United States Patent
Satake et al.

(10) Patent No.: US 8,335,617 B2
(45) Date of Patent: Dec. 18, 2012

(54) SENSOR DETECTION CONTROLLER AND OCCUPANT DETECTION APPARATUS HAVING THE SAME

(75) Inventors: Masayoshi Satake, Okazaki (JP); Noboru Maeda, Chiryu (JP); Hiroyuki Mori, Obu (JP); Kouji Ootaka, Toyohashi (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 13/199,752

(22) Filed: Sep. 8, 2011

(65) Prior Publication Data

US 2012/0065845 A1 Mar. 15, 2012

(30) Foreign Application Priority Data

Sep. 10, 2010 (JP) ................................. 2010-203378

(51) Int. Cl.
*G06F 17/00* (2006.01)

(52) U.S. Cl. .............. 701/47; 701/45; 701/49; 340/506; 340/522; 340/529; 340/541; 340/577; 60/276; 60/277; 60/285; 123/688; 123/703; 204/426; 204/429; 102/427

(58) Field of Classification Search .................... 701/45, 701/47, 49; 340/506, 522, 529, 541, 577, 340/628, 963, 968; 60/276, 277, 285; 342/26 D; 123/688, 703; 204/426, 429; 102/427; 356/401; 367/136

See application file for complete search history.

(56) References Cited

U.S. PATENT DOCUMENTS

| | | | | |
|---|---|---|---|---|
| 5,386,695 | A | * | 2/1995 | Iwata et al. ..................... 60/276 |
| 5,676,119 | A | * | 10/1997 | Tsutsumi et al. ............. 123/688 |
| 5,743,085 | A | * | 4/1998 | Takaku et al. .................. 60/276 |
| 5,921,078 | A | * | 7/1999 | Takaku et al. .................. 60/277 |
| 6,047,634 | A | * | 4/2000 | Futsuhara et al. ............. 100/43 |
| 6,089,016 | A | * | 7/2000 | Takaku ........................... 60/277 |
| 7,102,527 | B2 | * | 9/2006 | Shieh et al. ................... 340/602 |
| 7,164,117 | B2 | * | 1/2007 | Breed et al. ................... 250/221 |
| 2008/0100425 | A1 | | 5/2008 | Kiribayashi |

FOREIGN PATENT DOCUMENTS

JP 2008-111809 5/2008

* cited by examiner

*Primary Examiner* — Mary Cheung
*Assistant Examiner* — McDieunel Marc
(74) *Attorney, Agent, or Firm* — Harness, Dickey & Pierce, PLC

(57) ABSTRACT

A sensor detection controller is used in combination with a capacitive sensor that is mounted on a seat of a vehicle in such a manner that a capacitance of the capacitive sensor changes according to whether the seat is occupied. The sensor detection controller has a fault detection mode and a normal detection mode. The sensor detection controller includes a signal source for applying an amplitude signal to the capacitive sensor, a switch for switching a signal path, through which the amplitude signal is applied, between the fault detection mode and the normal detection mode, a signal detector for detecting a change in a voltage or a current of the amplitude signal when the amplitude signal is applied, and an impedance member connected to the signal path.

11 Claims, 7 Drawing Sheets

SENSOR DETECTION CONTROLLER AND OCCUPANT DETECTION APPARATUS HAVING THE SAME

CROSS REFERENCE TO RELATED APPLICATION

This application is based on and claims priority to Japanese Patent Application No. 2010-203378 filed on Sep. 10, 2010, the contents of which are incorporated herein by reference.

TECHNICAL FIELD

The present invention relates to a sensor detection controller for performing a fault detection and a normal detection of a sensor, and also relates to an occupant detection apparatus having the sensor detection controller.

BACKGROUND

US 2008/0100425 corresponding to JP-A-2008-111809 discloses an occupant detection apparatus having a normal detection mode for determining whether an occupant is seated on a seat by using a capacitive sensor. The occupant detection apparatus further has a fault detection mode for determining whether the capacitive sensor is at fault. In the fault detection mode, a guard electrode of the capacitive sensor is grounded to a vehicle chassis, and a sinusoidal signal is applied by a power source to a main electrode of the capacitive sensor. A calculator calculates an impedance from a detected current or voltage and determines based on the impedance whether the capacitive sensor is at fault.

If the impedance between the main electrode and the guard electrode of the capacitive sensor is low, a load impedance connected to the power source becomes low. In this case, the current flowing in the circuit exceeds a maximum current value to which the power supply can supply the sinusoidal signal without distortion. As a result, distortion occurs in the sinusoidal signal, and a radio noise due to the distortion may be generated in the fault detection mode.

The radio noise may be reduced by connecting a resistor or the like to the circuit to reduce the current flowing in the circuit. In this case, the current varies depending on a resistance of the resistor connected to the circuit. Therefore, there is a concern that the detected current value is so small that it cannot be determined whether the occupant is seated on the seat in the normal detection mode.

SUMMARY

In view of the above, it is an object of the present invention to provide a sensor detection controller for reducing a radio noise in a fault detection mode and for ensuring a current value necessary for a normal detection mode. It is another object of the present invention to provide an occupant detection apparatus having the sensor detection controller.

According to an aspect of the present invention, a sensor detection controller is used in combination with a capacitive sensor. The capacitive sensor includes first and second electrode plates and mounted on a seat of a vehicle in such a manner that a capacitance of the capacitive sensor changes according to whether the seat is occupied. The sensor detection controller has a fault detection mode for detecting a fault of the capacitive sensor and a normal detection mode for detecting whether the seat is occupied based on a change in the capacitance. The sensor detection controller includes a signal source, a switching device, a signal detector, a control circuit, and an impedance member. The signal source applies an amplitude signal having a variable amplitude to the capacitive sensor. The switching device switches a signal path, through which the amplitude signal is applied, between the fault detection mode and the normal detection mode. The signal path includes a first path through which the amplitude signal is applied to the first electrode plate and a second path through which the amplitude signal is applied to the second electrode plate. The signal detector detects a change in a voltage or a current of the amplitude signal when the amplitude signal is applied. The control circuit controls the switching device and the signal detector. The impedance member has a predetermined impedance and connected to the signal path. The impedance member includes a first member connected to the first path and a second member connected to the second path.

According to another aspect of the present invention, a sensor detection controller is used in combination with a sensor that creates an electric field or radiating one of an electromagnetic wave and a sound wave. The sensor detection controller has a fault detection mode for detecting a fault of the sensor and a normal detection mode for performing a detection operation by using the sensor. The sensor detection controller includes a signal source, a first switching device, a signal detector, a control circuit, an impedance member, a short circuit, and a second switching device. The signal source applies an amplitude signal having a variable amplitude to the sensor. The first switching device switches a signal path, through which the amplitude signal is applied, between the fault detection mode and the normal detection mode. The signal detector detects a change in a voltage or a current of the amplitude signal when the amplitude signal is applied. The control circuit controls the first switching device and the signal detector. The impedance member has a predetermined impedance and connected to the signal path. The short circuit short-circuits the impedance member. The second switching device selectively activates and deactivates the short circuit. The control circuit causes the second switching device to deactivate the short circuit in the fault detection mode and causes the second switching device to activate the short circuit in the normal detection mode.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS

Embodiments are described below with reference to the drawings. Throughout the embodiments, the term "connected" can mean electrical connection.

First Embodiment

A sensor detection controller 2 according to a first embodiment of the present invention is described below with reference to FIGS. 1A and 1B. The sensor detection controller 2 has a fault detection mode and a normal detection mode. In the normal detection mode, the sensor detection controller 2 performs a normal detection by using a sensor 1 to detect or measure something. In the fault detection mode, the sensor detection controller 2 performs a fault detection to detect a fault, for example, in the sensor 1 itself and in connection between the sensor 1 and the sensor detection controller 2. That is, in the fault detection mode, it is determined whether the normal detection can be correctly performed. According to the first embodiment, the sensor 1 is a capacitive sensor.

Figure 1A:
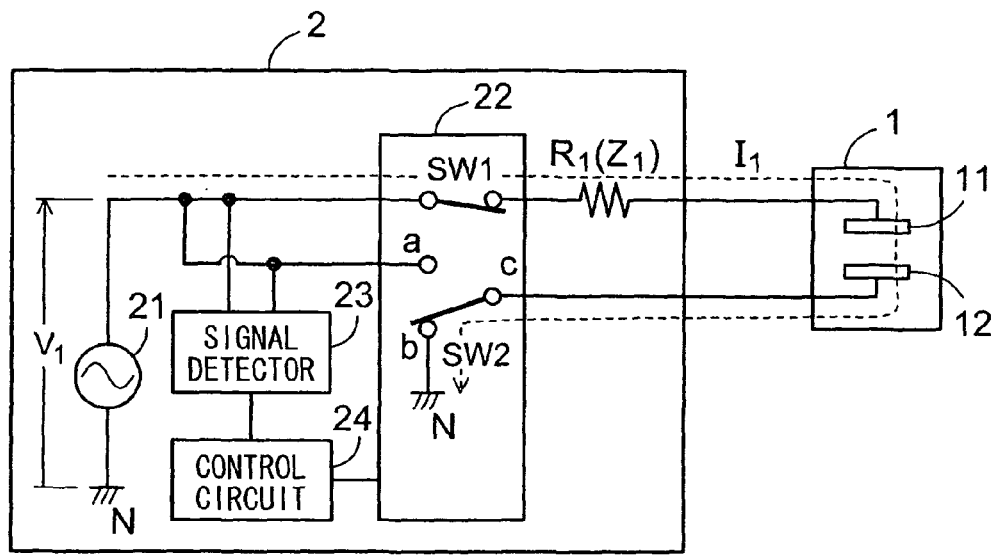
FIG. 1A is a diagram illustrating a sensor detection controller in a fault detection mode according to a first embodiment of the present invention.
Figure 1B:
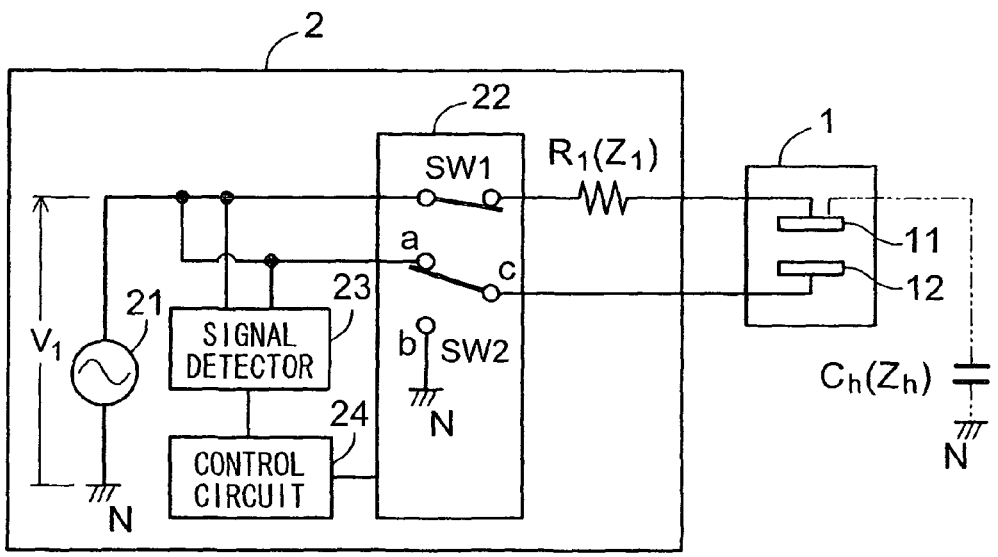
FIG. 1B is a diagram illustrating the sensor detection controller in a normal detection mode according to the first embodiment.

As shown in FIGS. 1A and 1B, the sensor detection controller 2 includes a signal source 21, a first switching device 22, a signal detector 23, a control circuit 24, and a resistor R1. When the fault detection or the normal detection is performed, a first end of the signal source 21 is connected to a common potential N, and a second end of the signal source 21 outputs an amplitude signal having a variable amplitude. According to the first embodiment, the amplitude signal is a sinusoidal signal. The common potential N is a common reference potential of the entire sensor detection controller 2. For example, the common potential N can be a potential of a chassis of a vehicle and can be zero. The amplitude and frequency of the sinusoidal signal vary depending on the intended use of the sensor 1. For example, the sinusoidal signal can have a peak-to-peak amplitude of 1.0V relative to a base value of 2.5V and a frequency of from 50 KHz to 90 KHz. The sensor 1 has a first electrode plate 11 and a second electrode plate 12. The first electrode plate 11 serves as a detection electrode. The second electrode plate 12 is located on a back side of the first electrode plate 11 and serves as a guard electrode with respect to the first electrode plate 11.

The first switching device 22 is connected between the signal source 21 and a series circuit of the resistor R1 and the sensor 1. The first switching device 22 includes a first switch SW1 and a second switch SW2. The first switch SW1 and the second switch SW2 are independently controller by the control circuit 24 to switch a signal path through which the sinusoidal signal (i.e., current I1) is applied to the sensor 1. In an example shown in FIGS. 1A and 1B, the first switch SW1 and the second switch SW2 are contact switches. Alternatively, the first switch SW1 and the second switch SW2 can be relays (e.g., electromagnetic relays, semiconductor relays), transistors (e.g., bipolar transistors, field-effect transistors), photocouplers, or the like. In the fault detection mode, as shown in FIG. 1A, the second switch SW2 is switched to a terminal b. The terminal b is connected to the common potential N. In the normal detection mode, as shown in FIG. 1B, the second switch SW2 is switched to a terminal a. The second switch SW2 is switched between the terminal a and the terminal b in accordance with a switch signal from the control circuit 24. As described later, the first switch SW1 is used to select one sensor 1 targeted for the fault detection and the normal detection from multiple sensors 1.

The signal detector 23 detects a change in voltage or current of the sinusoidal signal, when the sinusoidal signal is applied. For example, the signal detector 23 detects a change in voltage or current between a base terminal of the first switch SW1 and the terminal a of the second switch SW2. For example, in the fault detection mode shown in FIG. 1A, the second electrode plate 12 is connected to the common potential N, and the sinusoidal signal is applied by the signal source 21 to the first electrode plate 11 so that the current I1 can flow between the first electrode plate 11 and the second electrode plate 12. At this time, the signal detector 23 calculates an impedance value of the sensor 1 based on the current or voltage and determines based on the impedance value whether a fault occurs. In contrast, in the normal detection mode shown in FIG. 1B, the sinusoidal signal is applied by the signal source 21 to both the first electrode plate 11 and the second electrode plate 12 so that the second electrode plate 12 can serve as a guard electrode with respect to the first electrode plate 11. Thus, only an object located on a front side of the first electrode plate 11 can be a target for detection. For example, when a human body having a predetermined relative permittivity approaches the sensor 1, a capacitor Ch (impedance Zh) connected between the first electrode plate 11 and the common potential N is created as indicated by a broken line in FIG. 1B. Thus, impedance values of the sensor 1 and the human body can be calculated based on the current and voltage detected when the sinusoidal signal is applied.

The control circuit 24 controls the overall sensor detection controller 2, in particular, the first switching device 22 and the signal detector 23. The signal detector 23 and the control circuit 24 can be implemented as software or hardware. For example, the signal detector 23 and the control circuit 24 can be software controlled by using a CPU or a microcomputer. For another example, the signal detector 23 and the control circuit 24 can be hardware controlled by using an IC (e.g., LSI, gate array) or a circuit device such as a transistor.

The resistor R1 corresponding to an impedance member Z1 is connected between the first switching device 22 and the sensor 1. That is, the resistor R1 is connected to the signal path through which the sinusoidal signal is applied to the sensor 1. An impedance (i.e., resistance) value Z of the resistor R1 is determined as follows.

When a voltage V1 applied by the signal source 21 to the sensor 1 has a voltage value V, the current I1 flowing in the signal path indicated by the broken line in FIG. 1A has a current value I, and the sensor 1 has an impedance value $Z_{mg}$, an equation (1) can be obtained:

$$\dot{I} = \frac{\dot{V}}{\dot{Z} + \dot{Z}_{mg}} \quad (1)$$

The equation (1) can be rewritten as follows:

$$\dot{Z} = \frac{\dot{V}}{\dot{I}} - \dot{Z}_{mg} \quad (2)$$

The phasors of the voltage value V, the current value I, the impedance value Z, and the impedance value $Z_{mg}$ are given as follows:

$$\begin{cases} \dot{V} = V_m e^{-j(\omega t - \theta)} \\ \dot{I} = I_m e^{-j(\omega t - \theta - \varphi)} \\ \dot{Z} = Z_{Re} + jZ_{Im} \\ \dot{Z}_{mg} = Z_{mgRe} + jZ_{mgIm} \end{cases}$$

In the above, t is a time, ω is an angular velocity, θ is a phase, φ is a phase difference between voltage and current, $V_m$ is a maximum amplitude of voltage, $I_m$ is a maximum amplitude of current, $Z_{mgRe}$ is an real part of $Z_{mg}$, and $Z_{mgIm}$ is an imaginary part of $Z_{mg}$. It is noted that the impedance value $Z_{mg}$ of the sensor 1 is an impedance value between the first electrode plate 11 and the second electrode plate 12.

The impedance value $Z_{mg}$ of the sensor 1 is discussed in detail below. When the capacitance part is dominant, the real part can be negligible (i.e., $Z_{mgRe} \approx 0$). Therefore, the impedance value $Z_{mg}$ can be approximated to the imaginary part $Z_{mgIm}$. Further, assuming that the impedance value $Z_{mg}$ is much smaller than the impedance value Z of the resistor R1 (i.e., $|Z| >> |Z_{mg}|$), the phase difference between the voltage and current becomes almost zero. Therefore, the impedance value Z of the resistor R1 can be given as follows:

$$|Z|(|Z_a|, |Z_b|) = \sqrt{\frac{V_m^2}{I_m^2} + Z_{mgIm}^2} \quad (3)$$

It is assumed that a maximum current value to which the signal source 21 can supply the sinusoidal signal without distortion in the fault detection mode is $I_{lim}$. Further, it is assumed that a minimum current value necessary for both the fault detection and normal detection is $I_{low}$. In this case, when the impedance value Z of the resistor R1 is set to an impedance value Za in a range satisfying the following inequality (4), a radio noise can be reduced without affecting a detection performance:

$$|Zd| = \sqrt{\frac{V_m^2}{I_{lim}^2} + Z_{mgIm}^2} \leq |Za| \leq \sqrt{\frac{V_m^2}{I_{low}^2} + Z_{mgIm}^2} = |Zu|, \quad (4)$$

where $I_{lim} \geq I_{low}$

Figure 2:
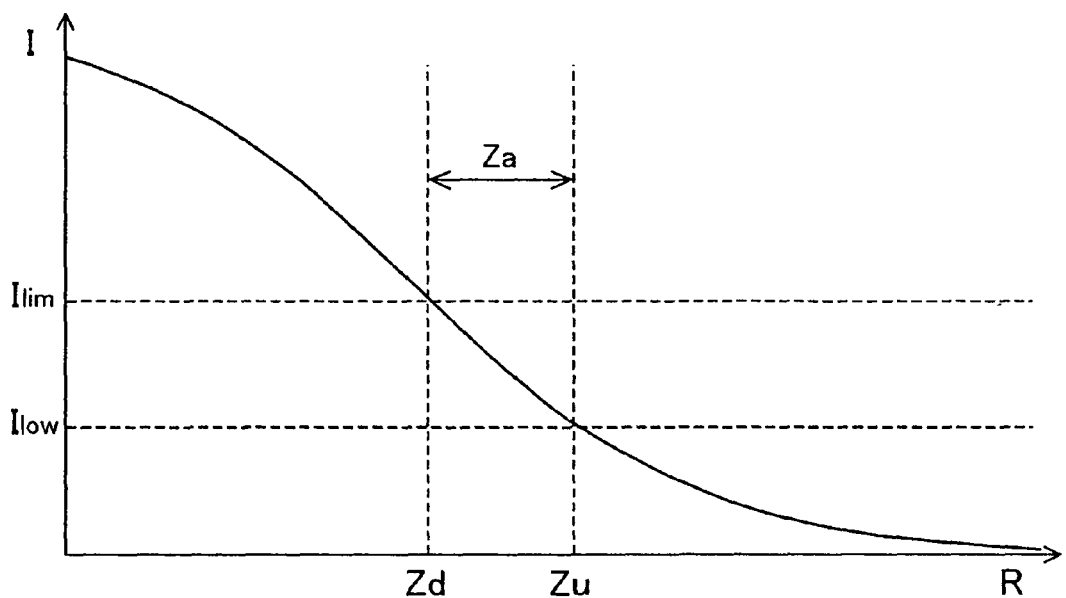
FIG. 2 is a diagram illustrating an impedance range of an impedance member of the sensor detection controller according to the first embodiment.

The inequality (4) is derived by substituting $I_{lim}$ and $I_{low}$ into $I_m$ of the equation (3). The range of the impedance value |Za| can be represented by a graph shown in FIG. 2. In FIG. 2, the longitudinal axis represents the current, and the horizontal axis represents the resistance.

Figure 3A:
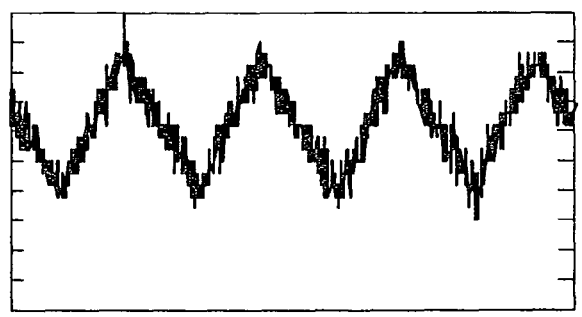
FIG. 3A is a diagram illustrating a sinusoidal signal observed when the impedance member is not connected.
Figure 3B:
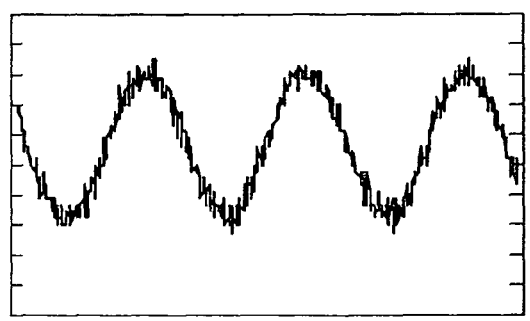
FIG. 3B is a diagram illustrating the sinusoidal signal observed when the impedance member is connected.

FIG. 3A shows the sinusoidal signal observed when the resistor R1 shown in FIGS. 1A and 1B is not connected. In contrast, FIG. 3B shows the sinusoidal signal observed when the resistor R1 shown in FIGS. 1A and 1B is connected. As can be seen by comparing FIGS. 3A and 3B, distortion in the sinusoidal signal is less when the resistor R1 is connected than when the resistor R1 is not connected.

Figure 4:
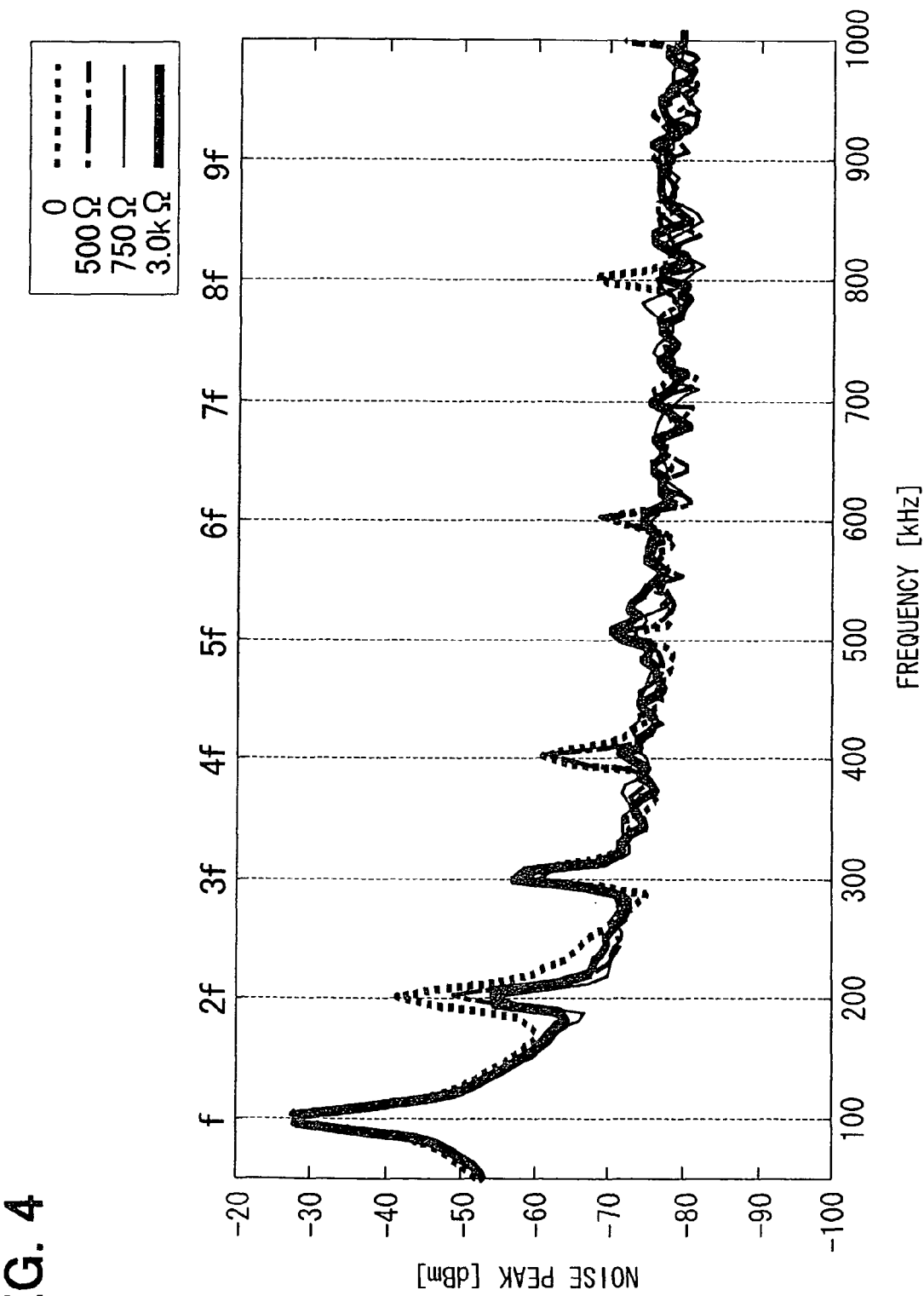
FIG. 4 is a diagram illustrating characteristics of a radio noise generated from a sensor.

FIG. 4 shows characteristics of the radio noise observed when $I_{lim}$=700 μA, $I_{low}$=250 μA, $V_m$=0.5V, and $Z_{mgIm}$=220Ω. In FIG. 4, the longitudinal axis represents a noise peak, and the horizontal axis represents a frequency. The radio noise characteristics were measured while changing the impedance value of the resistor R1 to 0Ω (i.e., no R1), 500Ω, 750Ω, and 3.0 kΩ. The sinusoidal signal has a fundamental frequency f of 100 kHz. In FIGS. 4, 2f, 3f, . . . , and 9f represents a second-order harmonic, a third-order harmonic, . . . , and a ninth-order harmonic, respectively.

From the inequality (4), 747Ω≦|Za|≦2012Ω . . . (5). FIG. 4 shows that the radio noise is less when the resistor R1 having the impedance value of 500Ω is connected than when no resistor R1 is connected. Further, FIG. 4 shows that the radio noise is less when the resistor R1 having the impedance value of 750Ω or 3.0 kΩ is connected than when the resistor R1 having the impedance value of 500Ω is connected.

There is no large difference in the radio noise characteristics between when the resistor R1 having the impedance value of 750Ω is connected and when the resistor R1 having the impedance value of 3.0 kΩ is connected. However, when the resistor R1 having the impedance value of 3.0 kΩ is connected, the minimum current value $I_{low}$ (=250 μA) necessary for the fault detection cannot be ensured. As a result, the fault detection cannot be accurately performed. For this reason, when the impedance value Z of the resistor R1 is set to the impedance value Za satisfying the inequality (5), the radio noise can be reduced as much as possible without affecting a detection performance. For example, when the resistor R1 having the impedance value of 750Ω is connected, the radio noise can be reduced by up to 15 dB.

Figure 5:
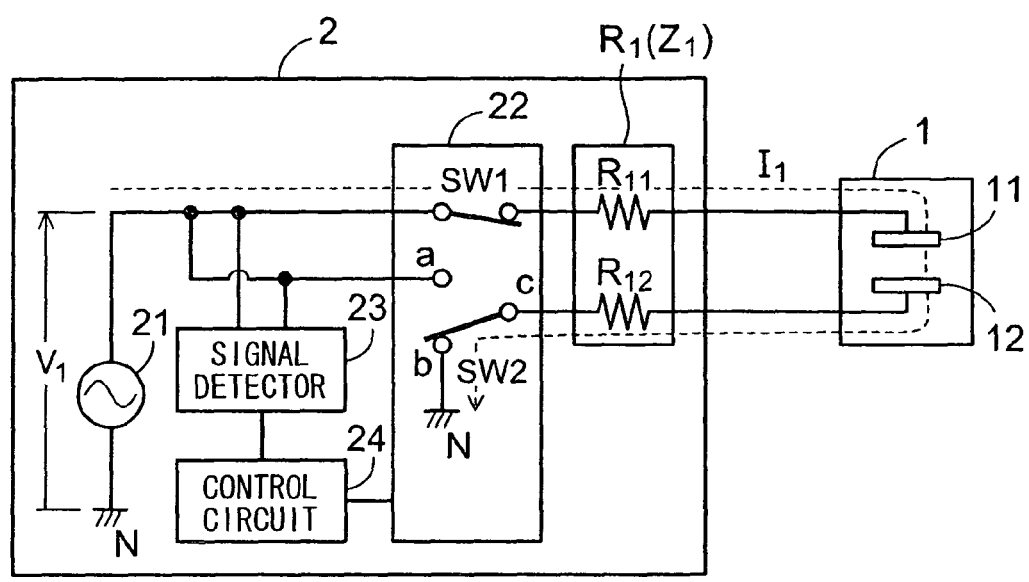
FIG. 5 is a diagram illustrating a sensor detection controller in a fault detection mode according to a modification of the first embodiment.

According to the first embodiment, the resistor R1 is connected between the first switch SW1 and the first electrode plate 11. Alternatively, the resistor R1 can be connected to any position in the signal path through which the current I1 flows. For example, although not shown in the drawings, the resistor R1 can be connected between the terminal c of the second switch SW2 and the second electrode plate 12. For another example, as shown in FIG. 5 corresponding to FIG. 1A, the resistor R1 can include a first resistor R11 connected between the first switch SW1 and the first electrode plate 11 and a second resistor R12 connected between the terminal c of the second switch SW2 and the second electrode plate 12. In the example shown in FIG. 5, the resistance value (i.e., impedance value |Za|) of the resistor R1 is set equal to the resistance values (i.e., impedance values |Z11|, |Z12|) of the resistors R11, R12. That is, |Za|=|Z11|+|Z12|.

Advantages of the first embodiment are summarized below. As described above, according to the first embodiment, the sensor detection controller 2 includes the signal source 21 for applying the sinusoidal signal (i.e., amplitude signal) to the sensor 1, the first switching device 22 for switching the signal path, through which the sinusoidal signal is applied, between the fault detection mode and the normal detection mode, the signal detector 23 for detecting the change in voltage or current on the sinusoidal signal when the sinusoidal signal is applied, the control circuit 24 for controlling the first switching device 22 and the signal detector 23, and the impedance member Z1 (i.e., resistor R1) connected to the signal path. The impedance value Z of the impedance member Z1 (i.e., resistance value of the resistor R1) is set so that the current value I of the current I1 on the signal path is equal to or less than the maximum current value $I_{lim}$ to which the signal source 21 is capable of applying the sinusoidal signal without distortion and equal to or greater than the minimum current value $I_{low}$ necessary for both the fault detection and the normal detection. In such an approach, in the fault detection mode, since the current value I of the current I1 flowing through the signal path is less or equal to the maximum current value $I_{lim}$, the radio noise can be reduced. Further, in the normal detection mode, since the current value I of the current I1 flowing through the signal path is greater or equal to the minimum current value $I_{low}$, the detection can be surely performed by using the sensor 1.

Specifically, the impedance value Z of the impedance member Z1 is set to the impedance value Za satisfying the inequality (4). Thus, the current value I of the current I1 flowing through the signal path in the fault detection mode is less or equal to the maximum current value $I_{lim}$ so that the fault detection can be performed while reducing the radio noise, and the current value I of the current I1 flowing through the signal path in the normal detection mode is greater or equal to the minimum current value $I_{low}$ so that the normal detection can be surely performed by using the sensor 1.

Further, according to the first embodiment, the impedance member Z1 is provided by at least one resistor. Specifically, in FIGS. 1A and 1B, the impedance member Z1 is provided by one resistor R1, and in FIG. 5, the impedance member Z1 is provided by two resistors R11, R12. In such an approach, the impedance member Z1 can be easily provided at low cost. Accordingly, the sensor detection controller 2 can be easily manufactured at low cost. The impedance member Z1 can be provided by three or more resistors in the same manner to obtain the same advantage.

Further, according to the first embodiment, the sensor 1 is a capacitive sensor having a predetermined capacitance and including at least two electrodes. The sensor 1 performs a detection based on a change in the capacitance. Even if the impedance value ($|Z_{mg}|$) of the sensor 1 is low, the current I1 flowing through the signal path is limited to the maximum current value $I_{lim}$ or less. Thus, the radio noise can be reduced.

Second Embodiment

Figure 6A:
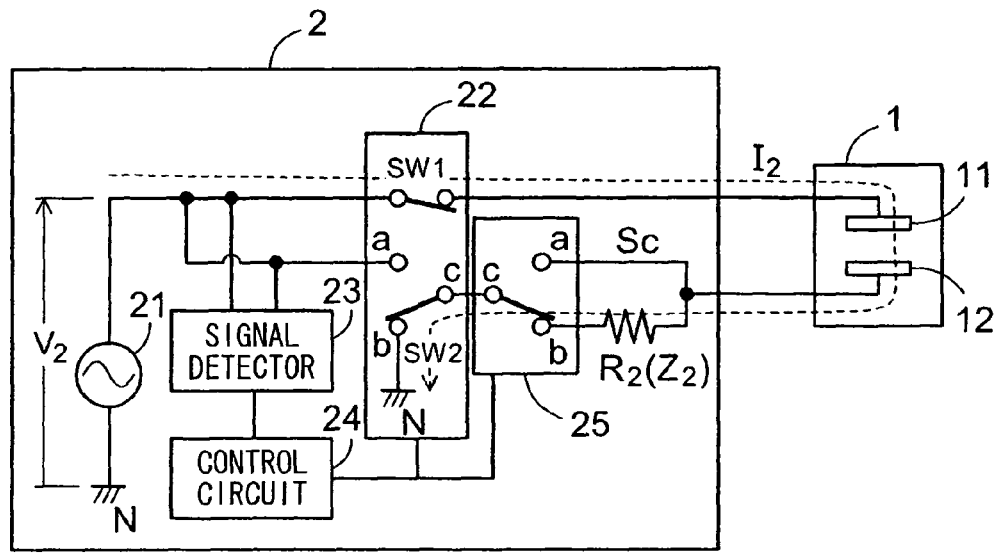
FIG. 6A is a diagram illustrating a sensor detection controller in a fault detection mode according to a second embodiment of the present invention.
Figure 6B:
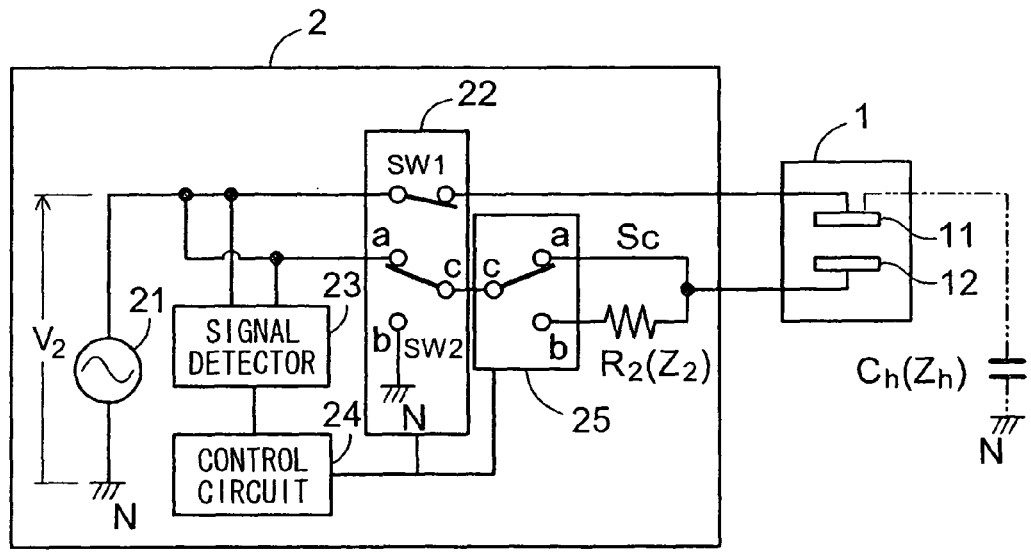
FIG. 6B is a diagram illustrating the sensor detection controller in a normal detection mode according to the second embodiment.

A sensor detection controller 2 according to a second embodiment of the present invention is described below with reference to FIGS. 6A and 6B. FIG. 6A is a diagram illustrating the sensor detection controller 2 in the fault detection mode, and FIG. 6B is a diagram illustrating the sensor detection controller 2 in the normal detection mode.

A difference between the first embodiment and the second embodiment is that the sensor detection controller 2 includes a second switching device 25. The second switching device 25 is configured in almost the same manner as the second switch SW2 of the first switching device 22 and connected between the second switch SW2 and the second electrode plate 12. Specifically, a terminal c of the second switching device 25 is connected to the terminal c of the second switch SW2, a terminal a of the second switching device 25 is connected through a short circuit Sc to the second electrode plate 12, and a terminal b of the second electrode plate 12 is connected to a first end of a resistor R2. A second end of the resistor R2 is connected to the second electrode plate 12. A voltage V2 is applied by the signal source 21 to the sensor 1. The voltage V2 can be equal to or different from the voltage V1 of the first embodiment.

In the fault detection mode shown in FIG. 6A, the second switch SW2 is switched to the terminal b connected to the common potential N, and the second switching device 25 is switched to the terminal b connected to the resistor R2. In the normal detection mode shown in FIG. 6B, the second switch SW2 is switched to the terminal a, and the second switching device 25 is switched to the terminal a that is connected to the short circuit Sc. Each of the second switch SW2 and the second switching device 25 is switched between the terminal a and the terminal b in accordance to the switch signal from the control circuit 24.

The resistor R2 corresponds to an impedance member Z2. An impedance (i.e., resistance) value Z of the resistor R2 is set to an impedance value Zb satisfy the following inequality (6):

$$\sqrt{\frac{V_m^2}{I_{lim}^2} + Z_{mglm}^2} \le |Zb| \le \sqrt{\frac{V_m^2}{I_{fail}^2} + Z_{mglm}^2}, \text{ where } I_{lim} \ge I_{low} \ge I_{fail} \quad (6)$$

In the inequality (6), $I_{lim}$ represents the maximum current value to which the signal source 21 can supply the sinusoidal signal without distortion in the fault detection mode, and $I_{fail}$ represents a minimum current value necessary for the fault detection. The minimum current value $I_{fail}$ is equal to or less than the minimum current value $I_{low}$ necessary for both the fault detection and the normal detection. When the impedance value Z of the resistor R2 is set to the impedance value Zb satisfying the inequality (6), the radio noise can be reduced without affecting a detection performance. The inequality (6) is derived in the same manner as the inequality (4). Specifically, the inequality (6) is derived by substituting $I_{lim}$ and $I_{fail}$ into $I_m$ of the equation (3).

Figure 7:
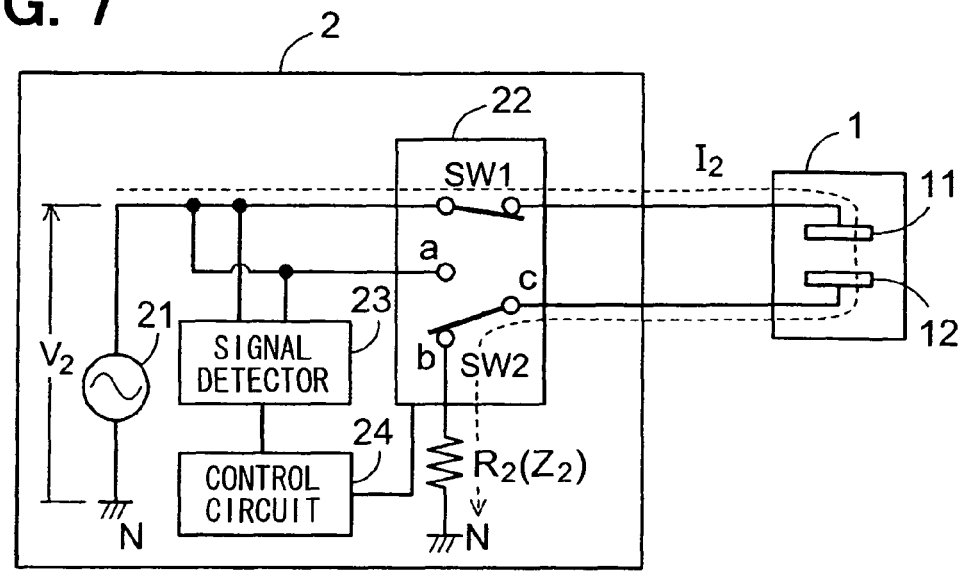
FIG. 7 is a diagram illustrating a sensor detection controller in a fault detection mode according to a modification of the second embodiment.

As shown in FIGS. 6A and 6B, the resistor R2 and the short circuit Sc are selectively connected between the second switch SW2 and the second electrode plate 12. Alternatively, the resistor R2 and the short circuit Sc can be selectively connected to any position in the signal path through which the current I2 flows. For example, although not shown in the drawings, the second switching device 25, the short circuit Sc, and the resistor R2 can be connected between the first switch SW1 and the first electrode plate 11. For another example, as shown in FIG. 7 corresponding to FIG. 1A, the resistor R2 can be connected between the terminal b of the second switch SW2 and the common potential N. In such an approach, the second switching device 25 and the short circuit Sc can be removed so that the manufacturing cost of the sensor detection controller 2 can be reduced.

Like the impedance member Z1 of the first embodiment, the impedance member Z2 can be provided by multiple resistors.

Advantages of the second embodiment are summarized below. As described above, according to the second embodiment, the sensor detection controller 2 includes the signal source 21 for applying the sinusoidal signal (i.e., amplitude signal) to the sensor 1, the first switching device 22 for switching the signal path, through which the sinusoidal signal is applied, between the fault detection mode and the normal detection mode, the signal detector 23 for detecting the change in voltage or current of the sinusoidal signal when the sinusoidal signal is applied, the control circuit 24 for controlling the first switching device 22 and the signal detector 23, the impedance member Z2 (i.e., resistor R2) connected to the signal path through which the sinusoidal signal is applied, the short circuit Sc for short-circuiting the impedance member Z2, and the second switching device 25 for switching the signal path to the impedance member Z2 side or the short circuit Sc side. That is, the second switching device 25 selectively activates and deactivates the short circuit Sc. In other words, the second switching device 25 selectively connects or disconnects the impedance member Z2 to or from the signal path. The impedance value Z of the impedance member Z2 (i.e., resistance value of the resistor R2) is set so that the current value I of the current I2 on the signal path is equal to or less than the maximum current value $I_{lim}$ to which the signal source 21 is capable of applying the sinusoidal signal without distortion and equal to or greater than the minimum current value $I_{fail}$ necessary for the fault detection. That is, the current value I of the current I2 on the signal path can be less than the minimum current value $I_{low}$ necessary for both the fault detection and the normal detection. In such an approach, since the current value I of the current I2 flowing through the signal path in the fault detection mode is less or equal to the maximum current value $I_{lim}$, the fault detection can be performed while reducing the radio noise. Further, since the current value I of the current I2 flowing through the signal path in the fault detection mode is greater or equal to the minimum current value $I_{fail}$, the fault detection can be surely performed. In the normal detection mode, the resistor R2 is disconnected from the signal path and thus does not affect a detection performance. Therefore, the normal detection can be surely performed by using the sensor 1.

Specifically, the impedance value Z of the impedance member Z2 (i.e., resistance value of the resistor R2) is set to the impedance value Zb satisfying the inequality (6). In such an approach, the current value I of the current I2 flowing through the signal path in the fault detection mode is less or equal to the maximum current value $I_{lim}$ so that the fault detection can be performed while reducing the radio noise, and the current value I of the current I2 flowing through the signal path in the fault detection mode is greater or equal to the minimum current value $I_{fail}$ so that the fault detection can be surely performed. In the normal detection mode, since the resistor R2 is disconnected from the signal path and does not affect a detection performance, the normal detection can be surely performed by using the sensor 1.

Third Embodiment

Figure 8A:
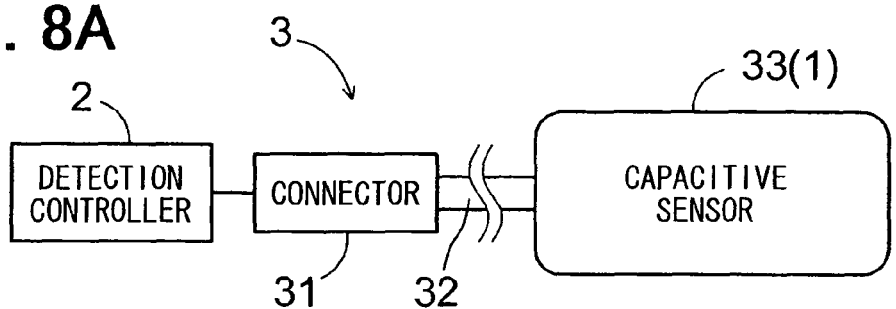
FIG. 8A is a block diagram illustrating an occupant detection apparatus according to a third embodiment of the present invention.
Figure 8B:
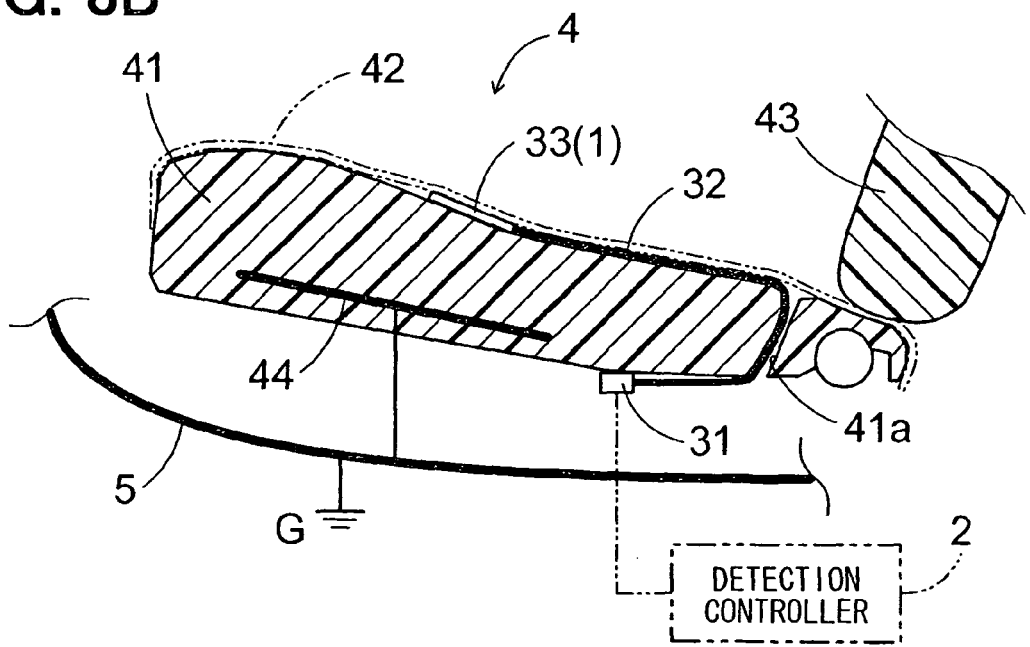
FIG. 8B is a diagram illustrating a seat equipped with the occupant detection apparatus.

An occupant detection apparatus 3 according to a third embodiment of the present invention is described below with reference to FIGS. 8A and 8B. FIG. 8A is a block diagram of the occupant detection apparatus 3. FIG. 8B is a diagram illustrating a side view of a vehicle seat 4 equipped with the occupant detection apparatus 3. The occupant detection apparatus 3 includes the sensor detection controller 2 of the first embodiment or the second embodiment.

The occupant detection apparatus 3 includes a connector 31, a wiring member 32, and a capacitive sensor 33 in addition to the sensor detection controller 2. The capacitive sensor 33 corresponds to the sensor 1 of the first embodiment or the second embodiment. The number of each component of the occupant detection apparatus 3 can vary depending on a shape of the vehicle seat 4, a position on the vehicle seat 4 at which detection is to be performed, and/or the like. The sensor detection controller 2 can be incorporated in an electronic control unit (or another control unit) or can be provided separately from such an electronic control unit.

The occupant detection apparatus 3 except the sensor detection controller 2 is installed in the vehicle seat 4. As shown in FIG. 8B, the vehicle seat 4 includes a first cushion pad 41, a second cushion pad 43, and a seat frame 44. The first cushion pad 41 is used as a seat base mainly for holding the hip and the thighs of an occupant of the vehicle. As indicated by a two-dot chain line in FIG. 8B, a front surface of the first cushion pad 41 is covered with a cover 42. The capacitive sensor 33 and the wiring member 32 are placed between the first cushion pad 41 and the cover 42. Although not shown in the drawings, the capacitive sensor 33 is placed in such a manner that the first electrode plate 11 is located on the front surface side (top side of FIG. 8B) of the first cushion pad 41 and the second electrode plate 12 is located on a back surface side (bottom side of FIG. 8B) of the first cushion pad 41. The wiring member 32 extends from the front surface to the back surface of the first cushion pad 41 through a through hole 41a of the first cushion pad 41 and is connected to the connector 31 that is located on the back surface of the first cushion pad 41.

The second cushion pad 43 is used as a seat back mainly for holding the back of the occupant. Like the first cushion pad 41, the second cushion pad 43 can be covered with a cover. The seat flame 44 is located on a bottom portion of the vehicle seat 4 and separated from the capacitive sensor 33. The seat flame 44 is connected to the common potential N (i.e., ground G) through a vehicle chassis 5. When the occupant is seated on the vehicle seat 4, the capacitor Ch (i.e., impedance Zh) shown in FIG. 1B and FIG. 6B is created between the first electrode plate 11 of the capacitive sensor 33 and the ground G. The sensor detection controller 2 detects a change in capacitance of the capacitive sensor 33, and it is determined based on the change in the capacitance whether the occupant is seated on the vehicle seat 4. In an example FIGS. 8A and 8B, the occupant detection apparatus 3 includes one capacitive sensor 33. Alternatively, the occupant detection apparatus 3 can include two or more capacitive sensors 33.

As described above, according to the third embodiment, the occupant detection apparatus 3 includes the sensor detection controller 2 and at least one capacitive sensor 33. The capacitive sensor 33 is mounted on the front surface side of the vehicle seat 4. so that the capacitance of the capacitive sensor 33 can change according to whether the occupant is seated on the vehicle seat 4. Since the occupant detection apparatus 3 includes the sensor detection controller 2, the fault in the capacitive sensor 33 can be easily detected. Thus, the occupant detection apparatus 3 can surely determine whether the occupant is seated on the vehicle seat 4.

(Modifications)

The above embodiments can be modified in various ways, for example, as follows.

Figure 9:
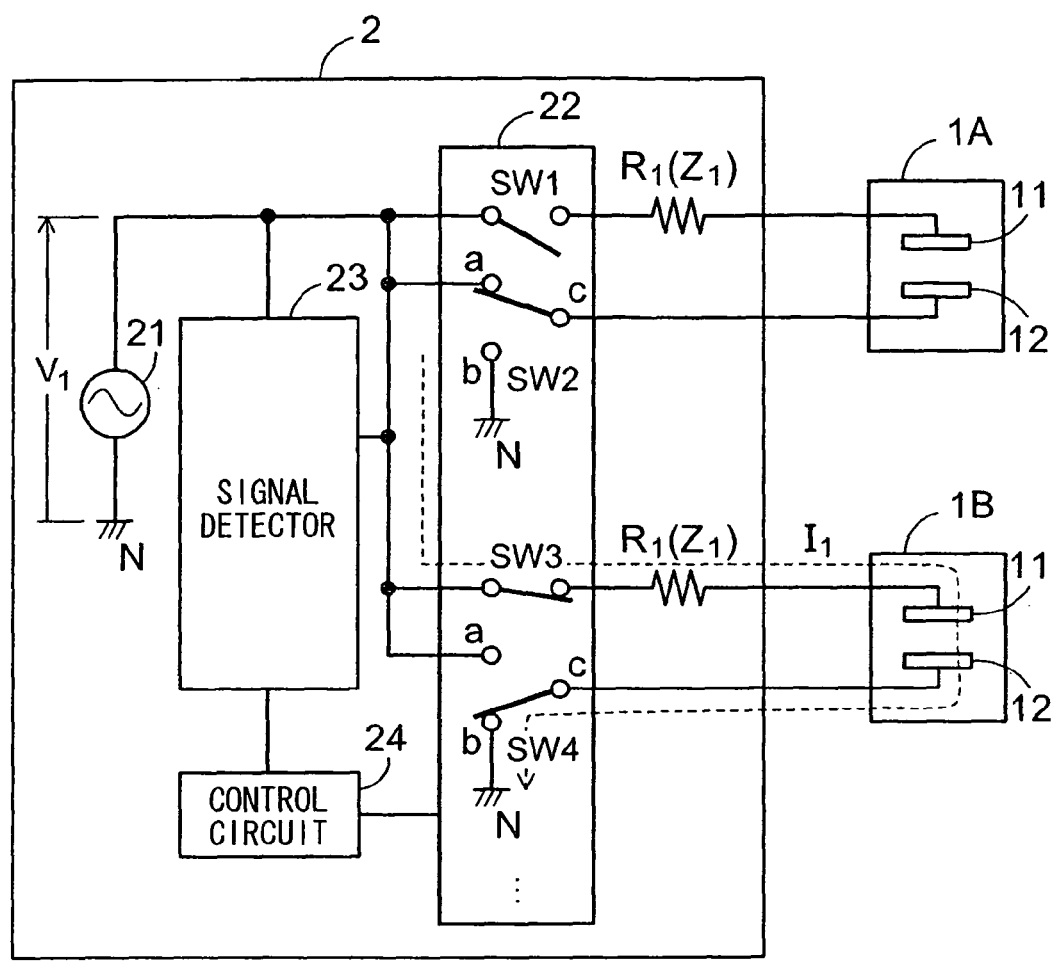
FIG. 9 is a diagram illustrating a sensor detection controller according to a modification of the embodiments.

In the first and second embodiments, the sensor detection controller 2 is configured to perform the fault detection and the normal detection of one sensor 1. Alternatively, the sensor detection controller 2 can be configured to perform the fault detection and the normal detection of two or more sensors 1. For example, as shown in FIG. 9, the sensor detection controller 2 can be configured to perform the fault detection and the normal detection of two sensors 1A and 1B. The sensor detection controller 2 shown in FIG. 9 differs from the sensor detection controller 2 shown in FIGS. 1A and 1B in the following three ways. Firstly, the first switching device 22 further includes a third switch SW3 and a fourth switch SW4. Secondly, the sensor detection controller 2 is configured to perform the fault detection and the normal detection of two sensors 1A and 1B. Thirdly, the resistor R1 (i.e., the impedance member Z1) is connected between the first switching device 22 and each of the sensors 1A and 1B.

The sensor detection controller 2 shown in FIG. 9 selects the sensor 1A or the sensor 1B by using the first switch SW1 or the third switch SW3, respectively. The sensor detection controller 2 performs the fault detection and the normal detection of the selected sensor. In an example shown in FIG. 9, the first switch SW1 is OFF, and the third switch SW3 is ON to select the sensor 1B. Thus, in the fault detection of the sensor 1B, the sinusoidal signal is applied to the sensor 1B through a signal path indicated by a broken line in FIG. 9. Since the resistor R1 (i.e., resistor Z1) is connected to the signal path, the same advantages as the first and second embodiments can be obtained. In FIG. 9, the sensor detection controller 2 performs the fault detection and the normal detection of two sensors. Alternatively, the sensor detection controller 2 can perform the fault detection and the normal detection of three or more sensors.

In the embodiments, the sensor 1 is a capacitive sensor. Alternatively, the sensor 1 can be a sensor other than a capacitive sensor, as long as the sensor 1 performs a detection operation by using electromagnetic waves or sound waves. For example, the sensor 1 can be a radio frequency sensor (e.g., radar) for radiating radio waves from a radio wave oscillator, a laser sensor for radiating laser (i.e., electromagnetic waves) form a laser oscillator, an infrared sensor for radiating infrared rays (i.e., electromagnetic waves) from a radiator, and a sound wave sensor (e.g., sonar) for radiating sound waves including ultrasound waves from a sound source. In such a sensor, if the sensor has a low impedance, there is a possibility that radio noise (i.e., harmonics) can be produced when an amplitude signal such as a sinusoidal signal is applied. Even in such a case, the radio noise can be reduced by connecting the impedance to the sensor. Further, since the minimum current value necessary for detection is ensured, the detection can be surely performed by using the sensor.

In the embodiments, the amplitude signal is a sinusoidal signal. Alternatively, the amplitude signal can be a signal other than a sinusoidal signal. For example, the amplitude signal can be a pulse signal, a triangle wave signal, a sawtooth wave signal, or the like. Even when such an amplitude signal is applied to perform detection, the detection can be surely performed by using the sensor 1.

In the embodiments, the impedance member Z1, Z2 are provided by the resistors R1, R2, R11, and R12. Alternatively, the impedance can be provided by a capacitor or a coil instead of or in addition to a resistor. Alternatively, the impedance can be provided by a combination of a resistor, a capacitor, and a coil that are connected in series or in parallel to form a circuit such as a RLC circuit or a LC circuit. In such a case, the total impedance of the circuit is set to satisfy the inequality (4) or (6). In such an approach, even when the impedance is provided by various types of passive elements, the radio noise can be reduced, and the detection can be surely performed by using the sensor 1.

Such changes and modifications are to be understood as being within the scope of the present invention as defined by the appended claims.

What is claimed is:

1. A sensor detection controller for use in combination with a capacitive sensor, the capacitive sensor including first and second electrode plates and mounted on a seat of a vehicle in such a manner that a capacitance of the capacitive sensor changes according to whether the seat is occupied, the sensor detection controller having a fault detection mode for detecting a fault in the capacitive sensor and a normal detection mode for detecting whether the seat is occupied based on a change in the capacitance, the sensor detection controller comprising:

a signal source configured to apply an amplitude signal having a variable amplitude to the capacitive sensor;

a switching device configured to switch a signal path, through which the amplitude signal is applied, between the fault detection mode and the normal detection mode, the signal path including a first path through which the amplitude signal is applied to the first electrode plate and a second path through which the amplitude signal is applied to the second electrode plate;

a signal detector configured to detect a change in a voltage or a current of the amplitude signal when the amplitude signal is applied;

a control circuit configured to control the switching device and the signal detector; and an impedance member having a predetermined impedance value and connected to the signal path, the impedance member including a first member connected to the first path and a second member connected to the second path.

2. The sensor detection controller according to claim 1, wherein the impedance value of the impedance member is set so that the current on the signal path is equal to or less than a maximum current value to which the signal source is capable of applying the sinusoidal signal without distortion and equal to or greater than a minimum current value necessary for both the fault detection mode and the normal detection mode.

3. The sensor detection controller according to claim 2, wherein the impedance of the impedance member is in a range satisfying the following inequality:

$$\sqrt{\frac{V_m^2}{I_{lim}^2} + Z_{mgIm}^2} \le |Za| \le \sqrt{\frac{V_m^2}{I_{low}^2} + Z_{mgIm}^2},$$

where $I_{lim} \ge I_{low}$ $V_m$ represents a maximum voltage value of the amplitude signal, $I_{lim}$ represents the maximum current value, $I_{low}$ represents the minimum current value, $Z_{mgIm}$ represents an imaginary part of an impedance value of the capacitive sensor, and Za represents the impedance value of the impedance member.

4. The sensor detection controller according to claim 1, wherein at least one of the first and second members includes a resistor.

5. An occupant detection apparatus for a vehicle comprising:

the capacitive sensor of claim 1, and the sensor detection controller of claim 1.

6. A sensor detection controller for use in combination with a sensor, the sensor creating an electric field or radiating one of an electromagnetic wave and a sound wave, the sensor detection controller having a fault detection mode for detecting a fault in the sensor and a normal detection mode for performing a predetermined detection operation by using the sensor, the sensor detection controller comprising:

a signal source configured to apply an amplitude signal having a variable amplitude to the sensor;

a first switching device configured to switch a signal path, through which the amplitude signal is applied, between the fault detection mode and the normal detection mode;

a signal detector configured to detect a change in a voltage or a current of the amplitude signal when the amplitude signal is applied;

a control circuit configured to control the first switching device and the signal detector;

an impedance member having a predetermined impedance value and connected to the signal path;

a short circuit configured to short-circuit the impedance member; and a second switching device configured to selectively activate and deactivate the short circuit, wherein the control circuit causes the second switching device to deactivate the short circuit in the fault detection mode and causes the second switching device to activate the short circuit in the normal detection mode.

7. The sensor detection controller according to claim 6, wherein the impedance value of the impedance member is set so that the current on the signal path is equal to or less than a maximum current value to which the signal source is capable of applying the sinusoidal signal without distortion and equal to or greater than a first minimum current value necessary for the fault detection mode.

8. The sensor detection controller according to claim 7, wherein the impedance value of the impedance member is in a range satisfying the following inequality:

$$\sqrt{\frac{V_m^2}{I_{lim}^2} + Z_{mgIm}^2} \le |Zb| \le \sqrt{\frac{V_m^2}{I_{fail}^2} + Z_{mgIm}^2},$$

where $I_{lim} \ge I_{low} \ge I_{fail}$ $V_m$ represents a maximum voltage value of the amplitude signal, $I_{lim}$ represents the maximum current value, $I_{fail}$ represents the first minimum current value, $I_{low}$ represents a second minimum current value necessary for both the fault detection mode and the normal detection mode, $Z_{mgIm}$ represents an imaginary part of an impedance of the sensor, and Zb represents the impedance value of the impedance member.

9. The sensor detection controller according to claim 6, wherein at least one of the first and second members includes a resistor.

10. The sensor detection controller according to claim 6, wherein the sensor is a capacitive sensor having a predetermined capacitance and including a plurality of electrode plates, and the detection operation is performed based on a change in the capacitance.

11. An occupant detection apparatus for a vehicle comprising:

the sensor of claim 6, and the sensor detection controller of claim 6, wherein the sensor is a capacitive sensor and mounted on a seat of a vehicle in such a manner that a capacitance of the capacitive sensor changes according to whether the seat is occupied, and the detection operation is performed based on a change in the capacitance to determine whether the seat is occupied.

* * * * *